United States Patent [19]

Imamura et al.

[11] Patent Number: 4,698,605

[45] Date of Patent: Oct. 6, 1987

[54] MONOLITHIC LC FEED-THROUGH FILTER HAVING A FERRITE BODY WITH A RE-OXIDIZED CAPACITIVE LAYER

[75] Inventors: Eiji Imamura, Ishikawa; Takashi Kumokawa, Yokaichi; Fumio Nakayama, Kyoto; Haruhumi Mandai, Takatsuki; Iwao Fukutani, Nagaokakyo; Kunisaburo Tomono, Kyoto, all of Japan

[73] Assignee: Murata Manufacturing Co., Ltd., Japan

[21] Appl. No.: 830,909

[22] Filed: Feb. 18, 1986

Related U.S. Application Data

[63] Continuation of Ser. No. 547,781, Nov. 2, 1983, abandoned.

[30] Foreign Application Priority Data

Nov. 4, 1982 [JP] Japan ................................ 57-194169

[51] Int. Cl.[4] ............................................. H03H 7/01
[52] U.S. Cl. ..................................... 333/184; 361/302
[58] Field of Search ................................ 333/182–185; 361/302, 309, 311, 312; 339/147 R, 143 R

[56] References Cited

U.S. PATENT DOCUMENTS

| Re. 29,258 | 6/1977 | Fritz | 333/182 |
| 3,023,383 | 2/1962 | Schlicke | 333/185 X |
| 3,268,783 | 8/1966 | Saburi | 357/10 |
| 3,546,638 | 12/1970 | Park | 333/182 |
| 3,789,263 | 1/1974 | Fritz et al. | 333/182 X |
| 4,109,292 | 8/1978 | Shibayama | 361/302 X |

Primary Examiner—Eugene R. LaRoche
Assistant Examiner—Benny Lee
Attorney, Agent, or Firm—Ostrolenk, Faber, Gerb & Soffen

[57] ABSTRACT

This disclosure is directed to an improved LC filter which includes a cylindrical ferrite member of a semiconductor material formed with an inner bore which axially extends through its central portion, and having its grain boundary and/or at least its outer peripheral surface formed into an insulating layer, an electrode provided at least on the outer peripheral surface of the cylindrical ferrite member, and a through-conductor inserted into the inner bore of the cylindrical ferrite member.

6 Claims, 5 Drawing Figures

MONOLITHIC LC FEED-THROUGH FILTER HAVING A FERRITE BODY WITH A RE-OXIDIZED CAPACITIVE LAYER

BACKGROUND OF THE INVENTION

The present invention generally relates to an electrical filter and more particularyly, to an LC (i.e inductance L and capacitance C) filter compact in size and readily manufactured at high reliability and especially suitable for use in a loss distribution transmission circuit and the like.

Conventionally, a typical LC filter of this kind has a construction, for example, as illustrated in FIG. 1, and includes a central or throug-conductor t, a cylindrical ferrite member f fitted, at its central bore, over the through-conductor t, a dielectric member d disposed over the outer peripheral surface of the ferrite member f, and an electrode layer e further provided over the outer pheripheral surface of the dielectric material layer d, therby to form the LC filter between the electrode layer e and the through-conductor t.

In the known LC filter described above, the number of parts involved in the filter and consequently, the time required to assemble the filter are high since the ferrite member f for providing the inductance L and the dielectric member d for providing the capacitance C are respectively formed into separate parts. AS a result, the filter is not of compact size and is not efficient to produce. Moreover, due to the use in some cases of discrete LC parts for assembly, the resultant LC filters tend to be lown in strength, and without sufficient reliability.

SUMMARY OF THE INVENTION

Accordingly, an essential object of the present invention is to provide an improved LC filter which requires only a small number of parts to achieve compact size and ease of assembly.

Another important object of the present invention is to provide an LC filter of the above described type which is simple in construction, highly reliable, exhibits sufficient mechanical strength, and can be readily manufactured on a large scale at low cost.

In accomplishing these and other objects, according to one preferred embodiment of the present invention, there is provided an LC filter which includes a cylindrical ferrite member formed of a semi-conductor material and including an inner bore which axially extends through a central portion thereof, and having its grain boundary and/or at least its outer peripheral surface covered by an insultating layer, and electrode provided at least on the outer peripheral surface of the cylindrical ferrite member, and a through-conductor inserted into said inner bore of said cylindrical ferrite member.

By the arrangement according to the present invention as described above, an improved LC filter has been advantageously presented, with substantial elimination of disadvantages inherent in the conventional filters of this kind.

BRIEF DESCRIPTION OF THE DRAWINGS

These and other objets and features of the present invention will become apparent from the following description taken in conjunction with the preferred embodiment thereof with reference to the accompanying drawings, in which.

DETAILED DESCRIPTION OF THE INVENTION

Figure 1:
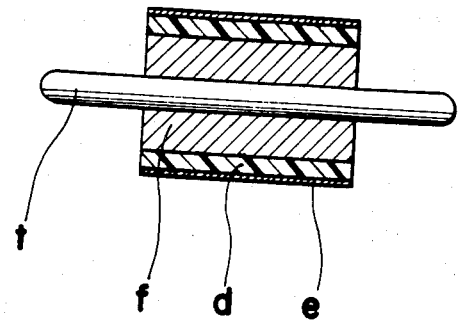
FIG. 1 is a side sectional view showing the construction of a conventional LC filter (already referred to)

Before the description of the present invention proceeds, it is to be noted that like parts are designated by like reference numerals throughout the accompanying drawings.

Figure 2:
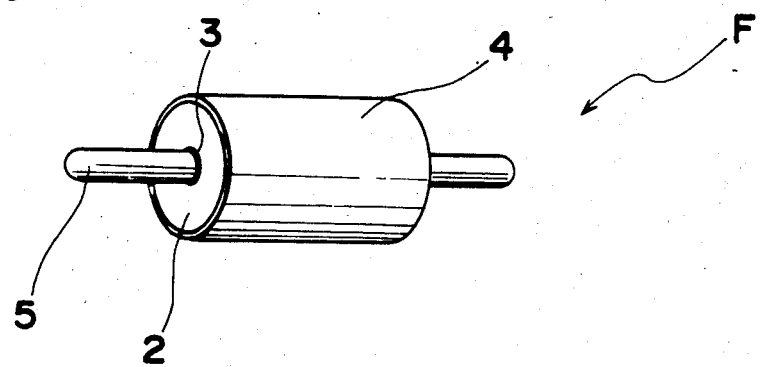
FIG. 2 is a perspective view of an improved LC filter according to one preferred embodiment of the present invention.
Figure 3:
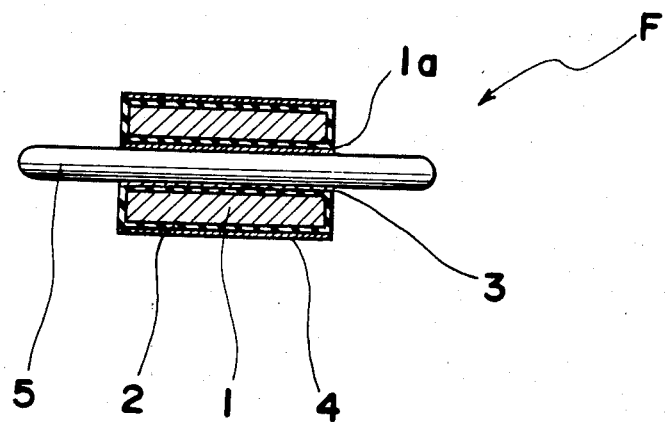
FIG. 3 is a side sectional view showing the construction of the LC filter of FIG. 2.

Referring now to the drawings, there is shwon in FIGS. 2 and 3 an LC filter F according to one preferred embodiment of the present invention, which generally includes a cylindrical ferrite member 1 formed of a semi-conductor material and having an inner bore 1a (FIG. 3) axially extending through a central portion thereof. The filter F has an insulating layer 2 covering the entire surface of said cylindrical ferrite member 1, an outer electrode or outer electrode layer 4 provided over the insulating layer 2 on the outer peripheral surface of the cylindrical ferrite member 1, an inner electrode or inner electrode layer 3 provided over the insulating layer 2 on the inner peripheral surface of the inner bore 1a, and a through-conductor 5 inserted into the inner bore 1a of the ferrite member 1. The through-conductor 5 is electrically connected to the inner electrode layer 3, for example, by such means as soldering, mechanical contact, etc. By way of example, a gap or clearance (not particularly shown) may be formed between the peripheral surface of the inner electrode 3 and that of the through-conductor 5 and that may be used to fill the gap between these elements to electrically connect the same.

By the above arrangement, an LC filter F which includes inductance L possessed by the cylindrical ferrite member 1 itself, and two capacitances C connected in series between the inner electrode 3 and the outer electrode 4 through the conductive cylindrical ferrite member 1, with the insulating layer 2 serving as a dielectric member, may be obtained in an integral structure.

Figure 5:
FIG. 5 is a schematic of the series connection of capacitors.

FIG. 5 is a schematic of the series connection.

Figure 4:
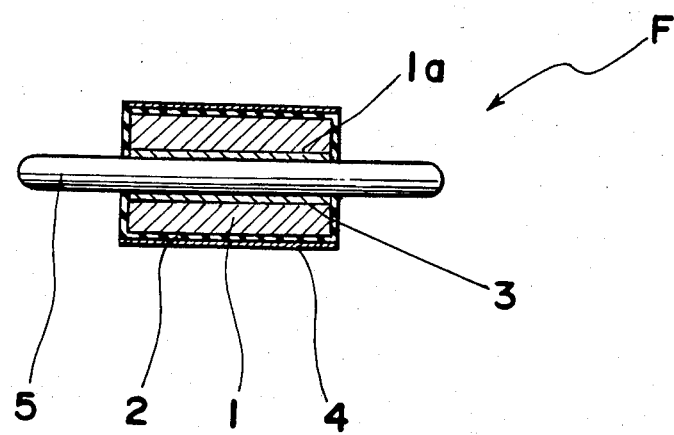
FIG. 4 is a side sectional view showing an alternative embodiment of the present invention.

It should be noted here that, in the foregoing embodiment, although the insulating layer 2 has been described as covering the entire surface of the cylindrical ferrite member 1 of the semi-conductor material, if the insulating layer 2 is not formed on the peripheral surface of the inner bore 1a of the member 1 (FIG. 4), the filter F will include a single capacitor defined between electrode 4 and the conductive ferrite member 1. The capacitance of this filter will be greater than that of the filter containing two series capacitors described above. In this alternate embodiment, it is necessary that the inner electrode 3 be held in ohmic contact with the ferrite member 1. As a further alternate embodiment, the cylindrical ferrite member 1 having the insulating layer 2 on the entire surface thereof, may be replaced by a ferrite member formed with insulating layers both on the outer peripheral surface and the crystalline grain boundary thereof. In this connection, the ferrite material described below is a ceramic material, which is originally polycrystal and an aggregate of small crystal particles. These crystal particles are grains, and the terminology "grain boundary" means the boundary face between the grains.

It is to be also noted that, in the embodiments as explained so far, the inner and outer electrodes 3 and 4 are respectively provided adjacent the inner and outer peripheral surfaces of the ferrite member 1. The provision of the inner electrode 3 is not, however, necessarily required. In the absence of the inner electrode 3, if the insulating layer 2 is present between the peripheral surface of the inner bore 1a of the ferrite member 1 and that of the through-conductor 5, the electrical conduction therebetween undesirably becomes insufficient, thus not being suitable for practical applications, and therefore, it is desirable to remove such insulating layer, for example, by grinding the peripheral surface of the inner bore 1a.

It should further be noted that the configurations of the ferrite member 1 and the through-conductor 5, and the coupling constructions thereof, etc. are not limited to those as illustrated in the drawsings, but may be altered in various ways within the scope of the present invention.

The cylindrical ferrite member 1 having the semiconductor characteristic as employed in the present invention, may be obtained, for example, by sintering iron surplus NiZn ferrite ($Ni_xZn_yFe_zO_4$ : $Z \geq 2$, $x+y+z=3$) in a mixed atmosphere of $N_2$ and $H_2$. Moreover, for insulating the surface of the ferriete member 1, the ferrite member may be subjected to re-oxidizing treatment in air or in an oxidizing atmosphere, while for insulating the surface and crystalline grain boundary of the ferrite member 1, it may be so arranged, for example, that an oxidizing agent composed of a mixture of Pb, Bi, Cu, Mn, etc. is applied over the ferrite member for heat diffusion through heat treatment in air. It is needless to say, however, that the means for insulating the ferrite member are not limited to those as described so far, but there may be employed various other means within the scope of the present invention.

As is clear from the foregoing description, according to the LC filter of the present invention, since it is so arranged that both inductance and capacitance are obtainable utilizing cylindrical ferrite member having semi-conductor characteristics, not only are the number of parts involved decreased for compact size, but the assembly of the LC filter is appreciably facilitated, with a consequent reduction in the cost for manufacture and control. Furthermore, owing to the fact that attaching of discrete LC parts, etc. is not required, the LC filter of the present invention is superior in the mechanical strength, even when it is formed into a compact size, with an improved reliability, and is particularly effective, if applied to a filter pin equivalent to a distribution transmission circuit.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. An LC filter consisting essentially of a cylindrical ferrite body of semi-conductor material having an axial bore extending through a central portion thereof, a ferrite oxidation formed insulating layer disposed on the outer peripheral surface of the ferrite member, an electrode disposed on the insulating layer which is located on the outer peripheral surface of said ferrite member, and a through-connector disposed in said axial bore of said cylindrical ferrite member electrically coupled with said cylindrical ferrite member.

2. An LC filter as claimed in claim 1, having an inner electrode disposed on the inner peripheral surface of said axial bore in said ferrite body and wherein said through-connector is electrically coupled with said ferrite member through said inner electrode.

3. An LC filter as claimed in claim 2 additionally having a ferrite oxidation formed insulating layer disposed on the inner peripheral surface of said axial bore in said ferrite body and wherein said inner electrode is disposed on said insulating layer on said axial bore peripheral surface.

4. An LC filter as claimed in claim 2 wherein said inner electrode is in ohmic contact with the inner peripheral surface of said axial bore.

5. An LC filter consisting essentially of a cylindrical ferrite body of semiconductor material having an axial bore extending through a central portion thereof and having an outer peripheral surface which has been oxidized so as to form an insulating layer disposed on the outer peripheral surface of the ferrite body, an electrode disposed on said insulating layer, and a through-conductor disposed through said axial bore of said cylindrical ferrite body and is electrically coupled with said cylindrical ferrite member.

6. An LC filter as claimed in claim 5 in which said ferrite body of semiconductor material is sintered iron surplus NiZn ferrite.

* * * * *